United States Patent
Shimoda et al.

(10) Patent No.: US 6,885,050 B2
(45) Date of Patent: Apr. 26, 2005

(54) FERROELECTRIC MEMORY DEVICE AND METHOD OF MANUFACTURING THE SAME

(75) Inventors: Tatsuya Shimoda, Suwa-gun (JP); Takao Nishikawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 174 days.

(21) Appl. No.: 10/153,925

(22) Filed: May 24, 2002

(65) Prior Publication Data

US 2002/0142491 A1 Oct. 3, 2002

Related U.S. Application Data

(62) Division of application No. 09/762,222, filed as application No. PCT/JP00/03590 on Jun. 2, 2000, now Pat. No. 6,420,190.

(30) Foreign Application Priority Data

| Jun. 4, 1999 | (JP) | ............................................. 11/157343 |
| Jun. 4, 1999 | (JP) | ............................................. 11/157344 |
| Mar. 21, 2000 | (JP) | ......................................... 2000/78545 |

(51) Int. Cl.[7] .................. H01L 29/76; H01L 29/94; H01L 31/113; H01L 31/119
(52) U.S. Cl. ................. 257/295; 257/532; 257/535
(58) Field of Search ............................... 257/295, 306, 257/532, 535, 552, 587

(56) References Cited

U.S. PATENT DOCUMENTS

| 5,335,138 A | 8/1994 | Sandhu et al. ............... 257/306 |
| 5,423,285 A | 6/1995 | Paz De Araujo et al. | |
| 5,627,013 A | 5/1997 | Kamisawa | |
| 5,686,151 A | 11/1997 | Imai et al. | |
| 5,846,686 A | 12/1998 | Kamisawa | |
| 5,874,364 A | * 2/1999 | Nakabayashi et al. .................. 257/E21.586 |
| 5,990,507 A | * 11/1999 | Mochizuki et al. ......... 257/295 |

FOREIGN PATENT DOCUMENTS

| EP | 0 834 912 A2 | 4/1998 |
| JP | A-5-136471 | 6/1993 |
| JP | A-7-86270 | 3/1995 |
| JP | A-7-273216 | 10/1995 |
| JP | A-8-260148 | 10/1996 |
| JP | A-9-82666 | 3/1997 |
| JP | A-9-92795 | 4/1997 |
| JP | A-9-223778 | 8/1997 |
| JP | A-9-246214 | 9/1997 |
| JP | A-9-249972 | 9/1997 |
| JP | A-10-50956 | 2/1998 |
| JP | A-10-107223 | 4/1998 |
| JP | A-11-8355 | 1/1999 |
| JP | A-11-145389 | 5/1999 |

* cited by examiner

*Primary Examiner*—Asok Kumar Sarkar
(74) *Attorney, Agent, or Firm*—Oliff & Berridge PLC

(57) ABSTRACT

A method of manufacturing a ferroelectric memory device includes a step of forming a first region (24) having surface characteristics allowing the material for the members of a ferroelectric capacitor section to be preferentially deposited, and a second region (26) having surface characteristics allowing the material for the capacitor section to be less deposited than the first region (24), and a step of providing the material on the base (10) to form a first electrode (32), a ferroelectric film (34), and a second electrode (36) in the first region (24) of the base (10).

9 Claims, 12 Drawing Sheets

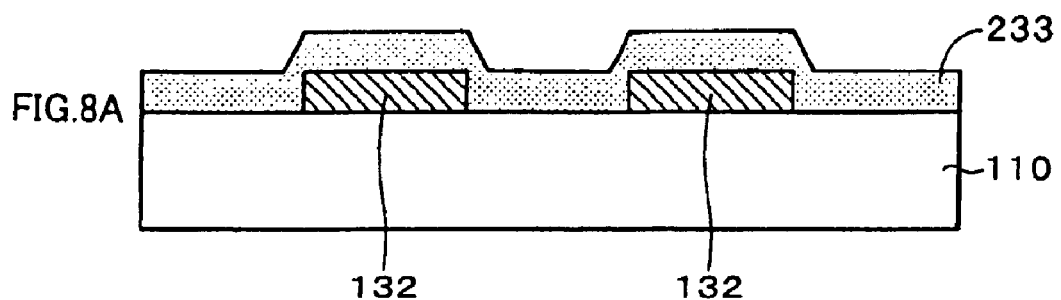
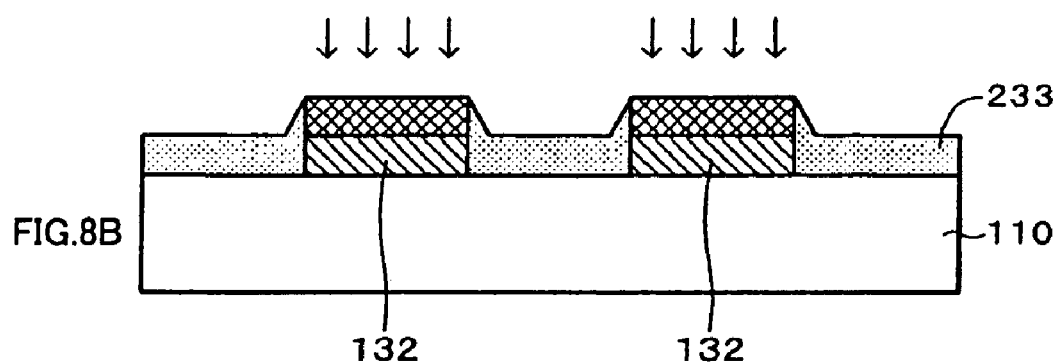
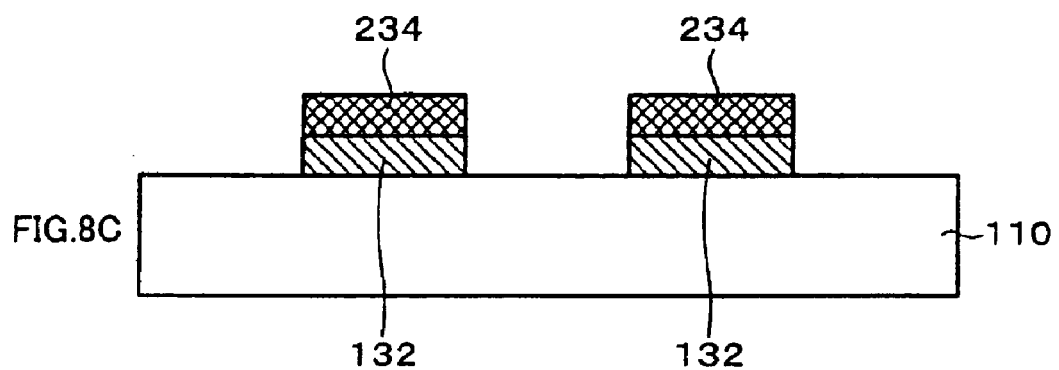

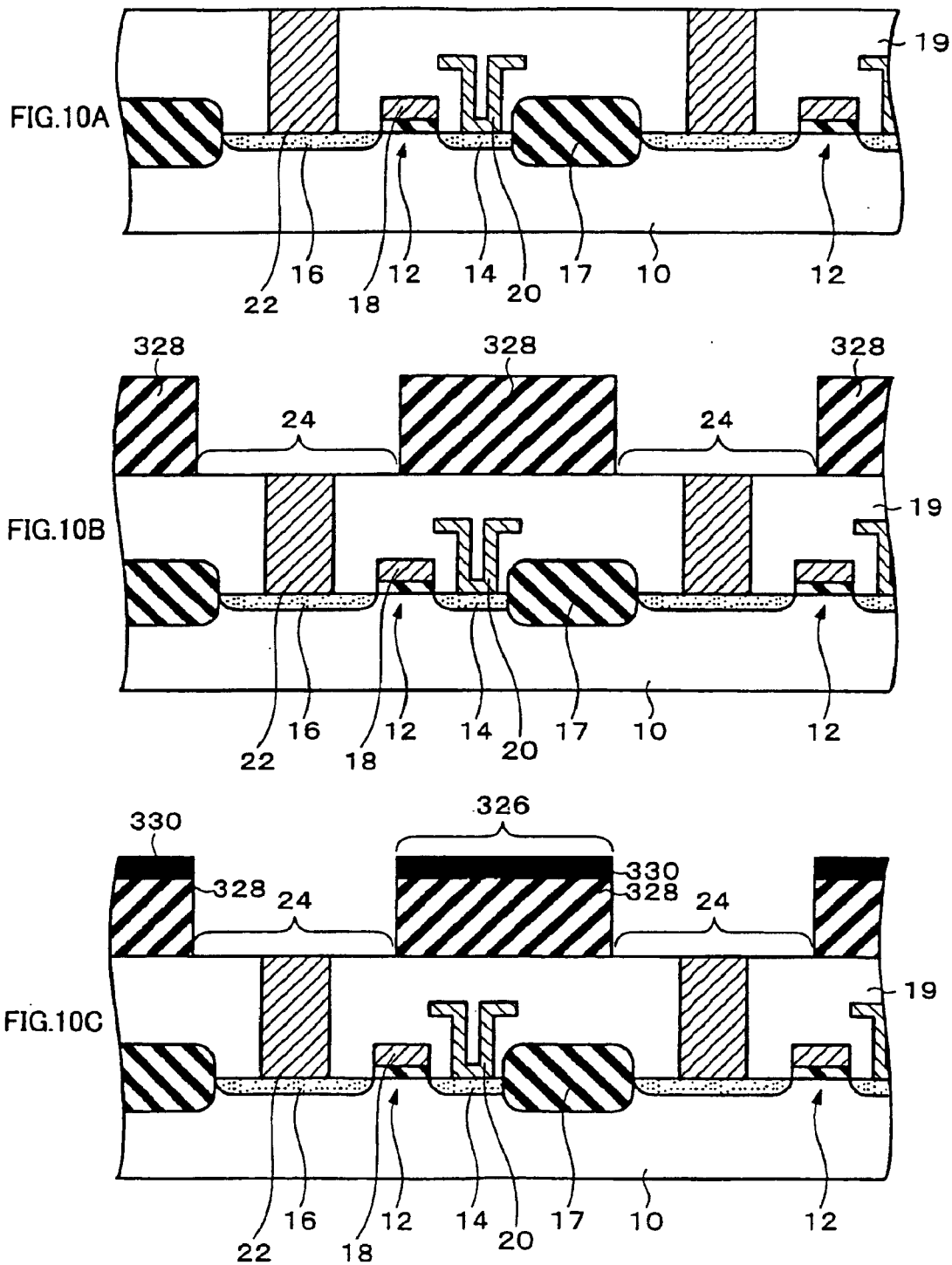

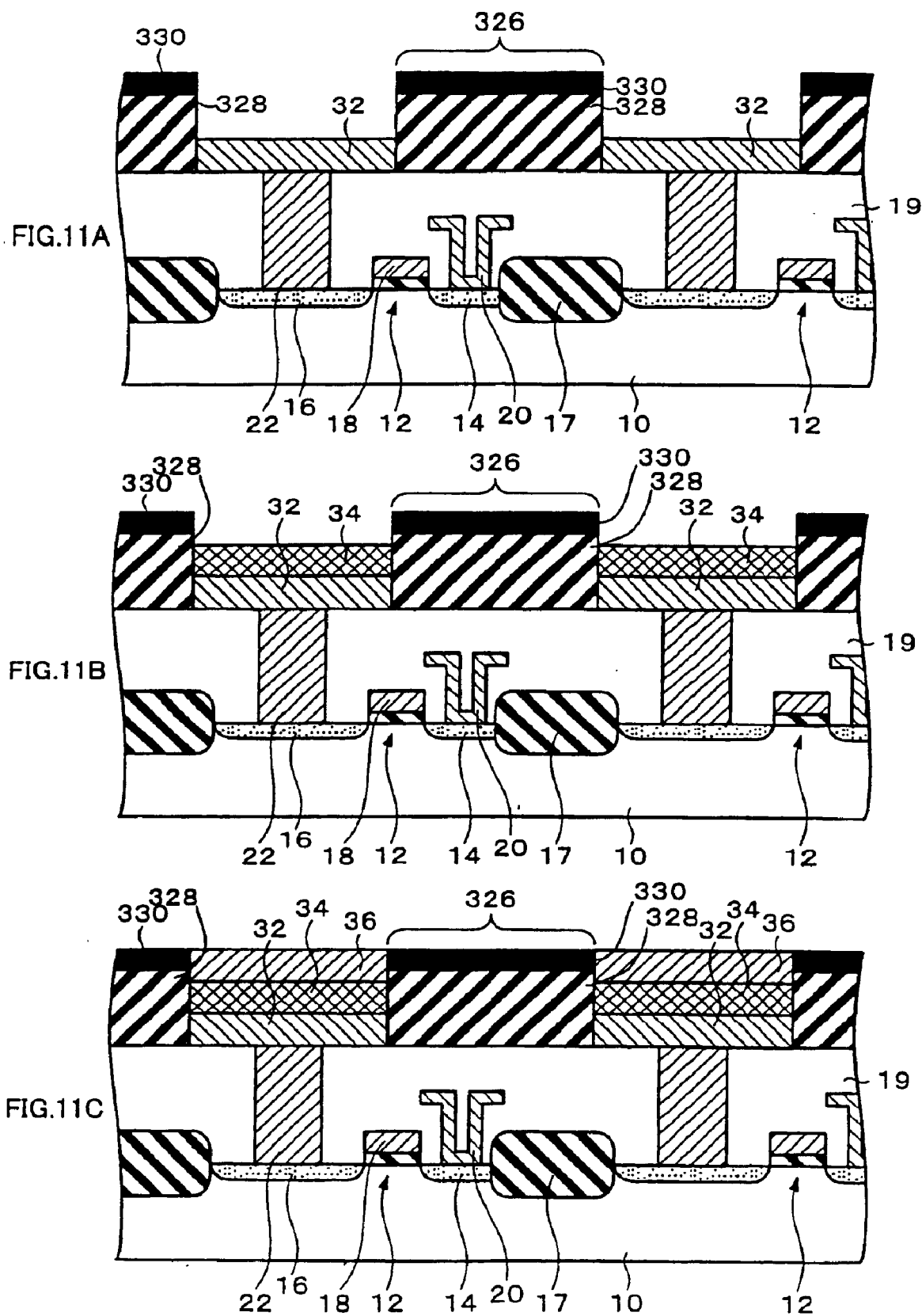

FERROELECTRIC MEMORY DEVICE AND METHOD OF MANUFACTURING THE SAME

This is a Division of application Ser. No. 09/762,222 filed Feb. 6, 2001, now U.S. Pat. No. 6,420,190, which in turn is a U.S. National stage of PCT/JP00/3590 filed Jun. 2, 2000. The entire disclosure of the prior application(s) is hereby incorporated by reference herein in its entirety.

TECHNICAL FIELD

The present invention relates to a ferroelectric memory device and a method of manufacturing the same.

BACKGROUND OF ART

A ferroelectric memory (FeRAM) retains data by spontaneous polarization of a ferroelectric film used in capacitor sections. Conventionally, the capacitor sections are formed by dry etching using a reactive gas with a patterned photoresist as a mask.

Since the materials for forming the capacitor sections, in particular, platinum (Pt) and iridium (Ir) suitably used as the electrode materials exhibit low reactivity to etching gas, conventional technology has employed etching with an increased physical effect (sputter etching). In this case, by-products produced during etching are not removed in the vapor phase but are redeposited on the side wall of the resist pattern. It is very difficult to remove these redeposited by-products, which remain as a structure. As a method for preventing redeposition of by-products on the side wall of the resist pattern, a method of etching while moving the resist backward has been proposed. However, this etching method causes the sidewall of the capacitor section to be sloped, whereby a high degree integration becomes difficult.

DISCLOSURE OF INVENTION

The present invention has been achieved to solve this problem. An object of the present invention is to provide a ferroelectric memory device which can be manufactured with high accuracy, and a method of manufacturing the same.

(1) The present invention provides a method of manufacturing a ferroelectric memory device provided with a capacitor section having a structure in which a first electrode, a ferroelectric film, and a second electrode are deposited, the method comprising the steps of:

forming a first region having surface characteristics allowing a material for forming at least one of the first electrode, the ferroelectric film, and the second electrode of the capacitor section to be preferentially deposited, and a second region having surface characteristics allowing a material for forming at least one member of the capacitor section to be less deposited than the first region; and providing the material for forming at least one member of the capacitor section to selectively form the member in the first region.

According to the present invention, at least one member of the capacitor section can be selectively formed in the first region, but is less formed in the second region. Therefore, at least one of the first electrode, the ferroelectric film, and the second electrode can be formed without etching.

(2) In this method of manufacturing a ferroelectric memory device, the first region and the second region may be formed on the surface of a base.

According to this configuration, at least one member of the capacitor section can be selectively formed on the surface of the base. In particular, degradation of the ferroelectric film can be reduced by applying the present invention when forming the first electrode and the second electrode, thereby easily achieving miniaturization of devices.

(3) In this method of manufacturing a ferroelectric memory device, the first electrode may be formed in the first region of the base by forming a layer of an electrode material on the base, the ferroelectric film may be formed on the first electrode by forming a layer of a ferroelectric material on the base, and the second electrode may be formed on the ferroelectric film by forming a layer of an electrode material on the base.

This enables the first electrode, the ferroelectric film, and the second electrode to be formed on the surface of the base in that order, whereby layers of all these members can be formed selectively.

(4) In this method of manufacturing a ferroelectric memory device, the surface of the base may be exposed in the first region, and a surface of the second region may be a surface-modifying film of which affinity to the electrode materials and the ferroelectric material is lower than an affinity of the exposed surface in the first region.

According to this configuration, affinity to the electrode materials and the ferroelectric material in the first region can be relatively increased by decreasing the affinity to the electrode materials and the ferroelectric material in the second region.

(5) This method of manufacturing a ferroelectric memory device may further comprise a step of removing the surface-modifying film after forming the first electrode, the ferroelectric film, and the second electrode.

(6) In this method of manufacturing a ferroelectric memory device, the surface-modifying film may be formed on the base and selectively removed in a region which becomes the first region to form the surface-modifying film only in the second region.

(7) In this method of manufacturing a ferroelectric memory device, the first electrode may be formed on the surface of the base, and a layer of the ferroelectric material is formed on the base and the first electrode, the first region and the second region may be formed on the surface of the formed ferroelectric material, and the second electrode may be formed in the first region by forming a layer of the electrode material on the formed ferroelectric material.

This enables the electrode material to be selectively formed on the surface of the formed ferroelectric material.

(8) This method of manufacturing a ferroelectric memory device may further comprise a step of removing the formed ferroelectric material in the region other than the second region after forming the second electrode.

(9) In this method of manufacturing a ferroelectric memory device, the surface of the formed ferroelectric material may be exposed in the first region, and, a surface of the second region may be a surface-modifying film of which affinity to the electrode material is lower than an affinity of the exposed surface of the formed ferroelectric material in the first region.

According to this configuration, affinity to the electrode material in the first region can be relatively increased by decreasing the affinity to the electrode material in the second region.

(10) In this method of manufacturing a ferroelectric memory device, the surface-modifying may be formed on an entire surface of the base and the first electrode, and selectively removed in a region which becomes the first region to form the surface-modifying film only in the second region.

(11) In this method of manufacturing a ferroelectric memory device, the first electrode may be formed on a surface of the base, the ferroelectric film may be formed on the first electrode, the first region may be formed on an upper surface of the ferroelectric film, the second region may be formed on surfaces of the base and the ferroelectric film excluding the upper surface of the ferroelectric film, and the second electrode may be formed in the first region by forming a layer of an electrode material on the base on which the first electrode and the ferroelectric film are formed.

This enables the electrode material to be selectively formed on the upper surface of the ferroelectric film.

(12) In this method of manufacturing a ferroelectric memory device, the step of forming the ferroelectric film may comprise:

a formation of a layer of an energy sensitive ferroelectric material on the base and the first electrode; and a provision of energy to the formed ferroelectric material, thereby removing the ferroelectric material excluding a region which becomes the ferroelectric film.

This allows the ferroelectric film to be easily formed.

(13) In this method of manufacturing a ferroelectric memory device, the upper surface of the ferroelectric film may be exposed in the first region, and a surface of the second region may be a surface-modifying film of which affinity to the electrode material is lower than an affinity of the exposed surface of the ferroelectric film in the first region.

According to this configuration, affinity to a material for forming the electrode material in the first region can be relatively increased by decreasing the affinity to a material for forming the electrode material in the second region.

(14) This method of manufacturing a ferroelectric memory device may further comprise a step of removing the surface-modifying film after forming the second electrode.

(15) In this method of manufacturing a ferroelectric memory device, the surface-modifying film may be formed on an entire surface of the first electrode and the ferroelectric film, and selectively removed in a region which becomes the first region to form the surface-modifying film only in the second region.

(16) In this method of manufacturing a ferroelectric memory device, a field effect transistor may be provided with a gate electrode, a source region, and a drain region which are formed on the base, and the ferroelectric memory device may have a structure in which the first region corresponds to the electrode section connected to at least one of the source region and the drain region.

(17) In this method of manufacturing a ferroelectric memory device, a material for forming at least one member of the capacitor section may be selectively deposited in the first region by providing a material for forming the at least one member of the capacitor section using vapor phase growth.

Vapor phase growth is a process for supplying a material to be deposited in a vapor phase.

(18) In this method of manufacturing a ferroelectric memory device, the vapor phase growth may be chemical vapor deposition and a selective deposition process may be carried out in the first region.

(19) In this method of manufacturing a ferroelectric memory device, the second region may be formed above the first region.

(20) In this method of manufacturing a ferroelectric memory device which may comprise two or more the first regions, a partition member may be formed between the first regions, and the second region may be formed on the partition member.

According to this configuration, since the first regions are separated by the partition member, a problem in which the material for the ferroelectric film or the second electrode adheres to the side of the first electrode, or the material for the second electrode adheres to the side of the ferroelectric film can be prevented.

(21) In this method of manufacturing a ferroelectric memory device, the partition member may be formed on the base, and the second region may be formed at least on a surface of the partition member opposite to the base.

(22) In this method of manufacturing a ferroelectric memory device, the thickness of the partition member may be equal to or greater than the thickness of the capacitor section.

This prevents unnecessary material from adhering to the side of the capacitor section.

(23) This method of manufacturing a ferroelectric memory device may further comprise a step of removing the partition members.

(24) The present invention also provides a method of manufacturing a ferroelectric memory device provided with a capacitor section having a structure in which a base, a first electrode, a ferroelectric film, and a second electrode are deposited, the method comprising the steps of:

forming, on a surface of the base, a first region having surface characteristics allowing a material for forming at least one of the first electrode, the ferroelectric film, and the second electrode of the capacitor section to be preferentially deposited, and a second region having surface characteristics allowing a material for forming at least one member of the capacitor section to be less deposited than the first region, and formed above the first region; and providing a material for forming at least one member of the capacitor section to selectively form the member in the first region.

According to the present invention, the first region and the second region are formed on the surface of the base. At least one member of the capacitor section can be selectively formed in the first region, but is less formed in the second region. Therefore, at least one of the first electrode, the ferroelectric film, and the second electrode can be formed without etching. In particular, degradation of the ferroelectric film can be reduced by applying the present invention when forming the first electrode and the second electrode, thereby easily achieving miniaturization of the device.

(25) In this method of manufacturing a ferroelectric memory device, the surface of the base may be exposed in the first region, and a surface of the second region may be a surface-modifying film of which affinity to the materials for forming the members of the capacitor section is lower than an affinity of the exposed surface in the first region.

(26) This method of manufacturing a ferroelectric memory device may further comprise a step of removing the surface-modifying film after forming at least one of the first electrode, the ferroelectric film, and the second electrode.

(27) A ferroelectric memory device according to the present invention is manufactured using the above method.

(28) A ferroelectric memory device according to the present invention comprises:

a base having a first region and a second region;

a first electrode formed in the first region;

a ferroelectric film formed on the first electrode; and a second electrode formed on the ferroelectric film, wherein the second region has surface characteristics allowing a material for forming at least one of the first electrode, the ferroelectric film, and the second electrode to be less deposited than a surface of the first region.

(29) In the ferroelectric memory device, the second region may be formed above a surface of the first region of the base.

(30) A ferroelectric memory device according to the present invention comprises:

a first electrode formed on a base;

a ferroelectric film formed on the first electrode; and a second electrode formed on the ferroelectric film, wherein the base and the first electrode have surface characteristics allowing a material for forming the second electrode to be less deposited than a surface of the ferroelectric film on which the second electrode is formed.

(31) In this ferroelectric memory device, a transistor connected to at least one of the first electrode and the second electrode may be formed on the base.

BRIEF DESCRIPTION OF DRAWINGS

FIGS. 8A to 8C are views showing a method of manufacturing a ferroelectric memory device according to a third embodiment of the present invention.

FIGS. 10A to 10C are views showing a method of manufacturing a ferroelectric memory device according to a fourth embodiment of the present invention.

FIGS. 11A to 11C are views showing a method of manufacturing a ferroelectric memory device according to an embodiment of the present invention.

BEST MODE FOR CARRYING OUT THE INVENTION

Preferred embodiments of the present invention will be described below with reference to drawings.

First Embodiment

FIGS. 1A to 3B are views showing a method of manufacturing a ferroelectric memory device according to a first embodiment of the present invention. A ferroelectric memory device is a nonvolatile semiconductor memory device. The minimum unit for storing information is a memory cell, which is formed by one transistor and one capacitor section, for example. A memory array can be formed by arraying a plurality of such memory cells. In this case, a plurality of memory cells can be arrayed in orderly rows and columns.

Formation of Transistor

Figure 1A:
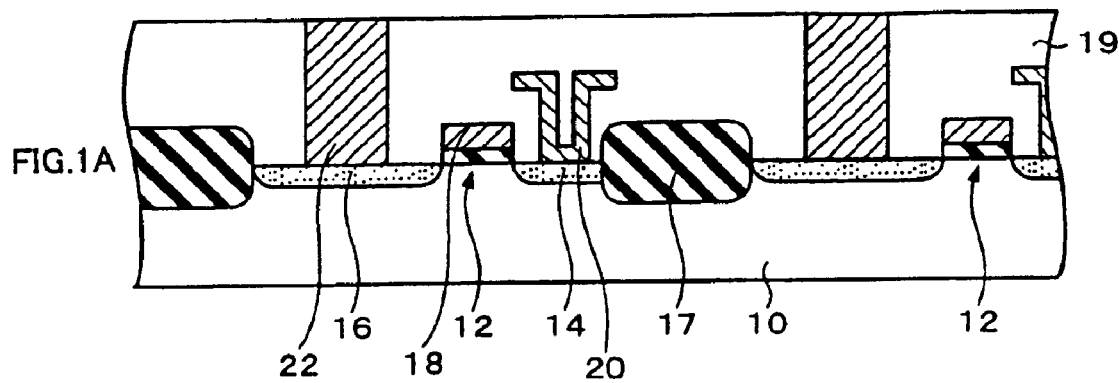
FIGS. 1A to 1C are views showing a method of manufacturing a ferroelectric memory device according to a first embodiment of the present invention.

Transistors 12 which control the ferroelectric memory device are formed on a subtrate 10 formed of a semiconductor wafer or the like, as shown in FIG. 1A. A structure in which functional devices such as transistors are optionally formed on the substrate 10 corresponds to a base. The transistors 12 may have a conventional configuration, and may be thin film transistors (TFTs). In the case of MOSFETs, the transistors 12 include a drain/source 14 and a drain/source 16 and a gate electrode 18. The gate electrode 18 is connected to a word line 44 (see FIG. 4). An electrode 20, which is connected to the drain/source 14, is connected to a bit line 42 (see FIG. 4). An electrode (plug) 22, which is connected to the drain/source 16, is connected to a first electrode 32 of the capacitor section of the ferroelectric memory device (see FIG. 2A). Each memory cell is isolated by a LOCOS (Local Oxidation of Silicon) 17. An interlayer dielectric 19 formed of $SiO_2$ and the like is formed on the transistors 12.

Formation of Capacitor Section

The capacitor sections are formed as follows. First, a step of providing selectivity to the surface characteristics of the base in which the transistors 12 are formed on the substrate 10 is carried out. Selectivity is provided to the surface characteristics of the base by forming regions having different surface characteristics, such as wettability, for materials to be deposited on the surface of the base. In the present embodiment, first regions 24 (see FIG. 1C) exhibiting affinity to the materials for forming the constituent members of the capacitor section, in particular, the materials for the electrodes, and a second region 26 (see FIG. 1C) of which the affinity to the materials for forming the constituent members of the capacitor section is lower than that of the first regions 24 are formed on the interlayer dielectric 19 and the exposed area of the electrode (plug) 22 formed on the substate 10. The capacitor sections of the ferroelectric memory device are selectively formed in the first regions 24 in a step described later, by utilizing the selectivity between each region, such as the deposition rate or adhesion to the base of the materials, caused by the difference in the surface characteristics. Specifically, at least one of the first electrodes 32, second electrodes 36, and ferroelectric films 34 of the capacitor sections is formed in the first regions 24 in a step described later, by a selective deposition process using chemical vapor deposition (CVD), physical vapor deposition, or a liquid phase process. In the case where the electrode (plug) 22 and the interlayer dielectric 19 formed on the substrate 10 have surface characteristics allowing the materials for forming the constituent members of the capacitor sections to be easily deposited, the surface of the base is exposed in the first regions 24 and a surface-modifying film 30 (see FIG. 1C) on which these materials are less deposited extent is formed on the second region 26, thereby providing selectivity relating to the deposition of the materials for forming the constituent members of the capacitor sections.

Formation of Surface-Modifying Film

Figure 1B:
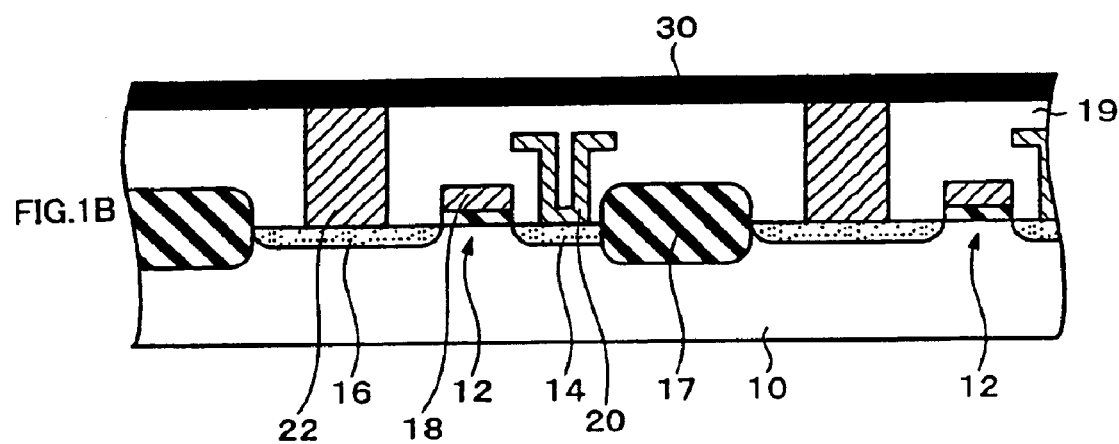
Figure 1C:
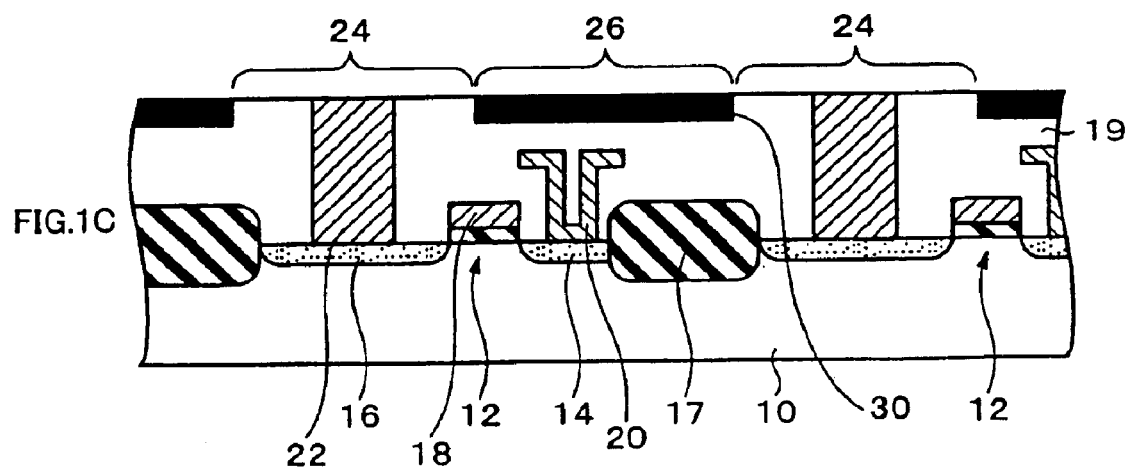

In the present embodiment, the surface-modifying film 30 is formed over the entire surface of the base, as shown in FIG. 1B. The surface-modifying film 30 is then removed in the first regions as shown in FIG. 1C. The surface-modifying film 30 is allowed to remain in the second region 26. Specifically, the following steps are carried out.

The surface-modifying film 30 may be formed using vapor phase growth such as CVD or using a liquid phase process such as spin coating or dip coating. In the latter case, a liquid or a substance dissolved in a solvent is used. For example, a silane coupling agent (organosilicon compound) or a thiol compound can be used. A thiol compound is a generic name for organic compounds containing a mercapto group (—SH) ($R^1$—SH; wherein $R^1$ represents a replaceable hydrocarbon group such as an alkyl group). Such a thiol compound is dissolved in an organic solvent such as dichloromethane or trichloromethane to prepare a solution with a concentration of about 0.1–10 mM, for example.

A silane coupling agent is a compound shown by $R^2{}_n SiX_{4-n}$ (wherein n is a natural number, $R^2$ represents a hydrogen atom or a replaceable hydrocarbon group such as an alkyl group), in which X represents —$OR^3$, —COOH, —$OOCR^3$, —$NH_{3-n}R^3{}_n$, —OCN, halogen, or the like (wherein $R^3$ represents a replaceable hydrocarbon group such as an alkyl group). Of these silane coupling agents and thiol compounds, compounds containing a fluorine atom in which $R^1$ or $R^3$ is $C_nF_{2n+1}C_mH_{2m}$ (wherein n and m are natural numbers) are particularly preferable. This is because these compounds increase surface free energy, thereby decreasing affinity to other materials.

Moreover, films produced using compounds containing a mercapto group or —COOH group using the above method may be used. Films formed from these materials may be used in the form of a monomolecular film or a built-up film thereof using an appropriate method.

Patterning of Surface-Modifying Film)

The surface-modifying film 30 is removed in the first regions 24, as shown in FIG. 1C. In the case of forming the surface-modifying film 30 using a silane coupling agent, irradiation of light may cause the molecular bonds to be broken at the interface between the surface-modifying film 30 and the electrode (plug) 22 or interlayer dielectric 19 formed on the substrate 10, whereby the surface-modifying film 30 may be removed. Mask exposure used in lithography can be applied to such a patterning using light. Alternatively, the surface-modifying film 30 may be directly patterned using laser beams, electron beams, ion beams, or the like without using a mask.

The surface-modifying film 30 may be selectively formed in the second region 26 by transferring the surface-modifying film 30 formed on another base, thereby enabling layer formation and patterning of the surface-modifying film 30 at the same time.

The first regions 24 and the second region 26 covered with the surface-modifying film 30 are thus provided with different surface conditions, as shown in FIG. 1C, thereby producing difference in the affinity to the materials for forming the constituent members of the capacitor sections formed in a step described later. In particular, in the case where the surface-modifying film 30 exhibits water repellency due to the presence of a fluorine molecule or the like, when using liquid materials for forming the constituent members of the capacitor sections, the materials can be selectively provided to the first regions 24. According to the material for the surface-modifying film 30, films may be formed in the first regions 24, on which the surface-modifying film 30 is not formed, using vapor phase growth due to the affinity to the materials for forming the upper layer members. As described above, each member of the capacitor sections of the ferroelectric memory device is formed in the succeeding steps by thus providing selectivity to the surface characteristics of the first regions 24 and the second region 26.

Formation of First Electrode

Figure 2A:
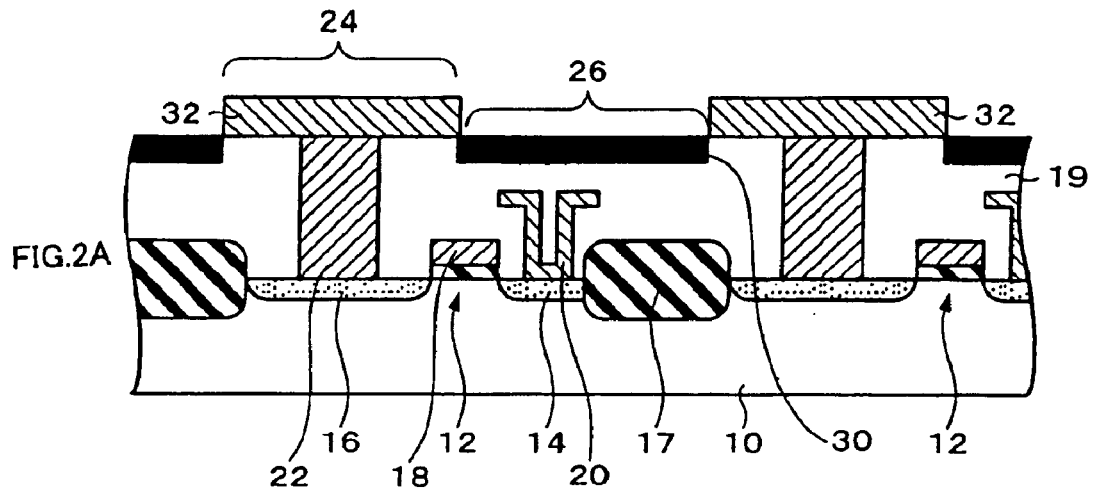
FIGS. 2A to 2B are views showing the method of manufacturing a ferroelectric memory device according to the first embodiment of the present invention.

First electrodes 32 which become lower electrodes of the capacitor sections of the ferroelectric memory device are formed in the regions corresponding to the first regions 24, as shown in FIG. 2A. Note that the term "in the regions corresponding to the first regions 24" means that the planar configuration of the first electrodes 32 may not be completely the same as the planar configuration of the plug 22. For example, a layer forming step using vapor phase growth is carried out for the entire surface of the base in which the transistors 12 are formed on the subtrate 10. This causes a selective deposition process to occur. Specifically, a layer is formed in the first regions 24 but is less formed in the second region 26, whereby the first electrodes 32 are formed only in the first regions 24. As vapor phase growth, it is preferable to use CVD, in particular, (Metal Organic Chemical Vapor Deposition). It is preferable that the material not be deposited in the second region 26. Note that it is sufficient that the layer forming rate in the second region 26 is at least two digits lower than in the first regions 24.

It is also preferable to form the first electrodes 32 using a method of selectively supplying a solution of the material to the first regions 24, or using mist deposition which selectively supplies mist of a solution of the material formed using ultrasonic means or the like to the first regions 24.

As the material for forming the first electrodes 32, Pt, Ir, or the like can be used. In the case of forming surface characteristic selectivity by forming the first regions 24 and the surface-modifying film 30 (second region 26) containing the above material on the base, the material for forming the electrodes can be selectively deposited using a compound containing Pt such as $(C_5H_7O_2)_2Pt$, $(C_5HFO_2)_2Pt$, or $(C_3H_5)(C_5H_5)Pt$, or a compound containing Ir such as $(C_3H_5)_3Ir$.

Formation of Ferroelectric Film

Figure 2B:
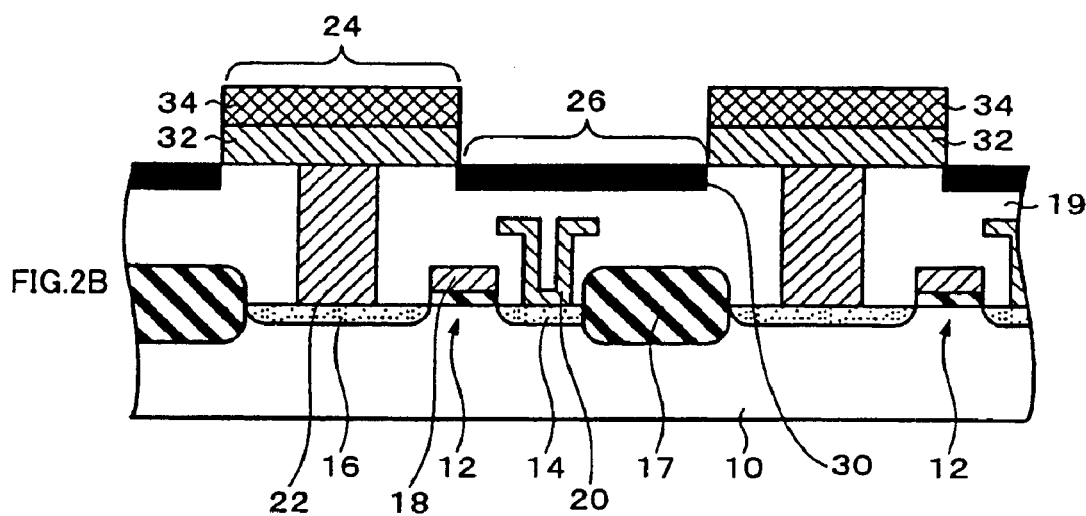

Ferroelectric films 34 are formed on the first electrodes 32, as shown in FIG. 2B. Specifically, a layer forming step using vapor phase growth is carried out for the entire surface of the base, for example. Since the layer is formed on the first electrodes 32, but is less formed in the second region 26, the ferroelectric films 34 are formed only on the first electrodes 32. As vapor phase growth, CVD, in particular, MOCVD can be used.

It is also preferable to form the ferroelectric films 34 using a method of selectively supplying a solution of the material on the first electrodes 32 formed in regions other than the second region 26 using an ink jet method, or using mist deposition which selectively supplies mist of a solution of the material formed using ultrasonic means or the like to regions other than the second region 24.

The composition of the material for the ferroelectric films 34 may be appropriately determined insofar as the material exhibits ferroelectricity and can be used as a capacitor insulating film, and the layer can be formed using CVD. For example, PZT piezoelectric materials, materials to which niobium or a metal oxide such as nickel oxide or magnesium oxide is added, and the like can be used. Specific examples include lead titanate ($PbTiO_3$), lead zirconate titanate ($Pb(Zr,Ti)O_3$), lead zirconate ($PbZrO_3$), lanthanum titanate (($Pb,La)TiO_3$), lanthanum lead zirconate titanate (($Pb,La)(Zr,Ti)O_3$), lead magnesium niobate zirconium titanate ($Pb(Zr,Ti)(Mg,Nb)O_3$), and the like. In addition, SBT containing Sr, Bi, and Ta as constituent elements may be used.

In the case where surface characteristic selectivity is formed by forming the first region 24 and the surface-modifying film 30 (second region 26) which contains the above material on the base, the material for forming the ferroelectric films 34 can be selectively deposited using PZT containing a Pb compound such as $Pb(C_2H_5)_4$, $(C_2H_5)_3PbOCH_2C(CH_3)_3$, or $Pb(C_{11}H_{19}O_2)_2$, a Zr compound such as $Zr(n\text{-}OC_4H_9)_4$, $Zr(t\text{-}OC_4H_9)_4$, $Zr(C_{11}H_{19}O_2)_4$, or $Zr(C_{11}H_{19}O_2)_4$, and a Ti compound such as $Ti(i\text{-}C_3H_7)_4$, or STB containing an Sr compound such as $Sr(C_{11}H_{10}O_2)_2$, a Bi compound such as $Bi(C_6H_5)_3$, and a Ta compound such as $Ta(OC_2H_5)_5$.

Formation of Second Electrode

Figure 3A:
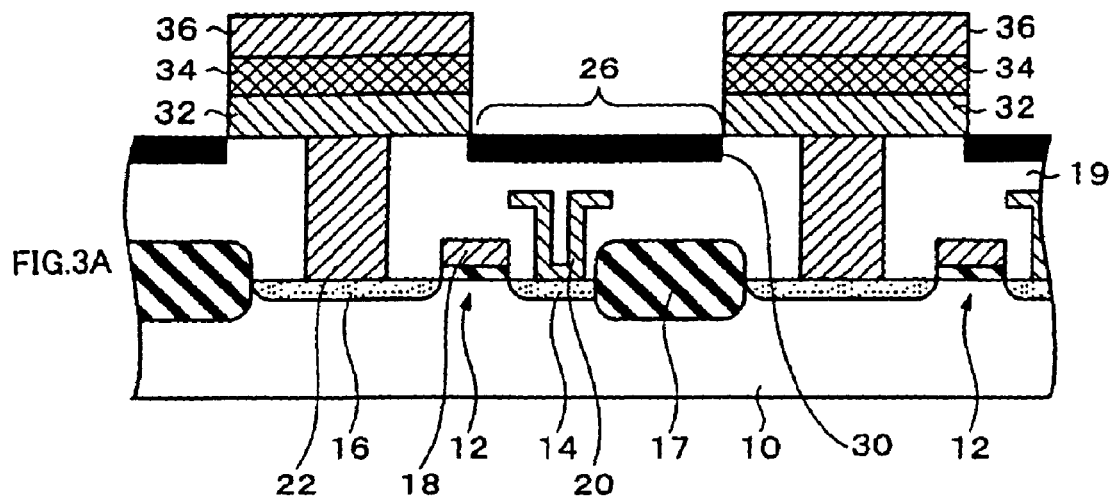
FIGS. 3A to 3B are views showing the method of manufacturing a ferroelectric memory device according to the first embodiment of the present invention.

Second electrodes 36 which become upper electrodes are formed on the ferroelectric films 34, as shown in FIG. 3A. Specifically, a layer forming step using vapor phase growth is preferably carried out for the entire surface of the base, for example. This causes the selective deposition process to occur. Specifically, since a layer is formed on the ferroelectric films 34, but is less formed in the second region 26, the second electrodes 36 are formed only on the ferroelectric films 34. As vapor phase growth, CVD, in particular, MOCVD can be applied.

It is also preferable to form the second electrodes 36 using a method of selectively supplying a solution of the material on the ferroelectric films 34 formed in regions other than the second region 26 using an ink jet method, or using mist deposition which forms mist of a solution of the material using ultrasonic means or the like and selectively supplies the mist to regions other than the second region 26.

The second electrodes 36 can be deposited by supplying an appropriate material prepared using a material similar to that for the first electrodes 32.

Removal of Surface-Modifying Film, etc.

Figure 3B:
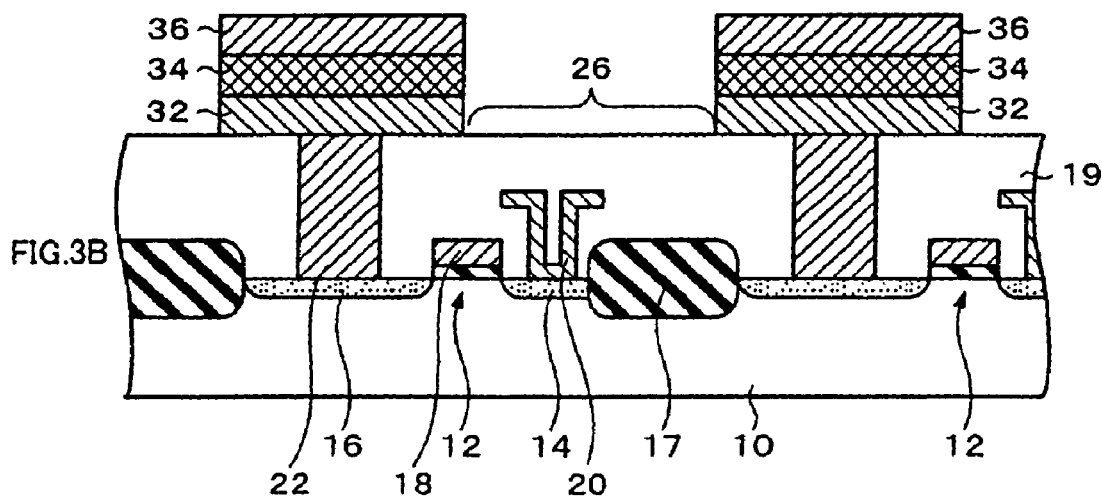

The surface-modifying film 30 formed in the second region 24 may be removed, as shown in FIG. 3B. This step is carried out after completing the layer forming step using vapor phase growth. The surface-modifying film 30 may be removed using the above method of patterning the surface-modifying film 30, for example. It is preferable to remove substances adhering to the surface of the surface-modifying film 30 when removing the surface-modifying film 30. For example, the materials for the first electrodes 32, ferroelectric films 34, and second electrodes 36 adhering to the surface of the surface-modifying film 30 may be removed. Note that the step of removing the surface-modifying film 30 is not a necessary condition of the present invention. The surface-modifying film 30 may be allowed to remain.

In the case where the ferroelectric film 34 is formed on the side of the first electrode 32 or the second electrode 36 is formed on the side of at least either the first electrode 32 or the ferroelectric film 34, it is preferable to remove these materials. In the removal step, dry etching can be applied, for example.

In the present embodiment, the surface-modifying film 30 is formed in the second region 26, thereby providing the first regions 24 and the second region 26 with surface characteristics differing in the depositionability of the material for forming at least one member (at least one of the electrodes and ferroelectric film) of the capacitor sections of the ferroelectric memory device. As a modification example, the surface-modifying film 30 may be formed in the first regions 24, and the material for forming at least one member of the capacitor section of the ferroelectric memory device may be provided with a liquid-phase or vapor-phase composition so as to be preferentially deposited on the surface of the surface-modifying film 30, thereby selectively forming the capacitor sections in the first regions 24.

Moreover, a thin layer of the surface-modifying film may be selectively formed on the surface of the second region 26, and at least one member of the capacitor sections of the ferroelectric memory device may be formed over the entire surface of the base including the first regions 24 and in the second region 26 by supplying a vapor-phase or liquid-phase material for that member. The material layer of this member may be selectively removed by polishing or a chemical technique only in the area where the thin layer of the surface-modifying film is formed, thereby selectively forming the material layer of this member in the first regions 24.

In addition, a film may not be formed on the surfaces of the first regions 24 and the second region 26. In this case, the surfaces of the first regions 24 and the second region 26 may be selectively provided with surface treatment so that the material for forming at least one member of the capacitor sections of the ferroelectric memory device is preferentially deposited in the first regions 24.

Structure of Ferroelectric Memory Device

The ferroelectric memory device can be manufactured by these steps. According to the present embodiment, the first electrodes 32, the ferroelectric films 34, and the second electrodes 36 can be formed without etching using a mask.

This ferroelectric memory device includes the lower electrodes consisting of the first electrodes 32 formed on the first regions 24, the ferroelectric films 34 formed on the first electrodes 32, and the upper electrodes consisting of the second electrodes 36 formed on the ferroelectric films 34. The surface-modifying film 30 on which the vapor-phase or liquid-phase materials for forming the capacitor sections are less deposited in comparison with the surface of the substrate 10 maybe formed in the second region 26 other than the first regions 24.

Figure 4:
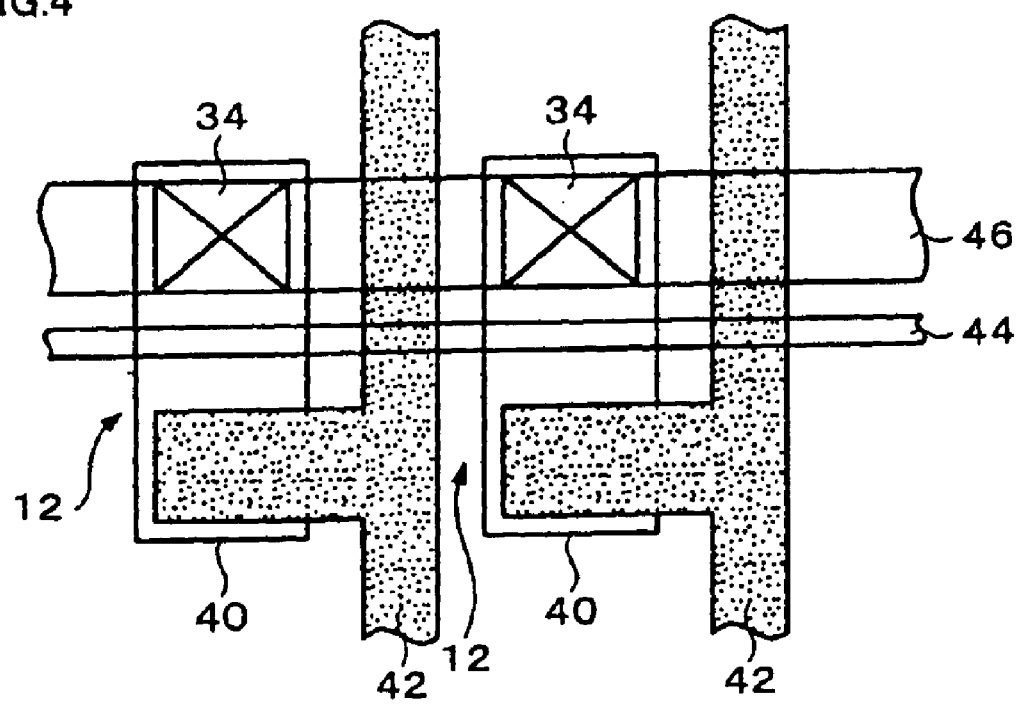
FIG. 4 is a plan view showing the ferroelectric memory device according to the first embodiment of the present invention.

FIG. 4 is a plan view showing a ferroelectric memory device according to an embodiment of the present invention. The ferroelectric memory device shown in FIG. 4 has a 2T2C cell structure (2-transistor, 2-capacitor).

The transistors 12 are formed in regions 40. The electrodes 20 connected to the drain/source 14 (see FIG. 3B) are connected to the bit lines 42 shown in FIG. 4. The gate electrodes 18 (see FIG. 3B) are connected to the word line 44 shown in FIG. 4. The electrodes 22 connected to the drain/source 16 (see FIG. 3B) are connected to a drive line 46 shown in FIG. 4. The ferroelectric films 34 are formed on the electrodes 22 through the first electrodes 32.

Figure 5:
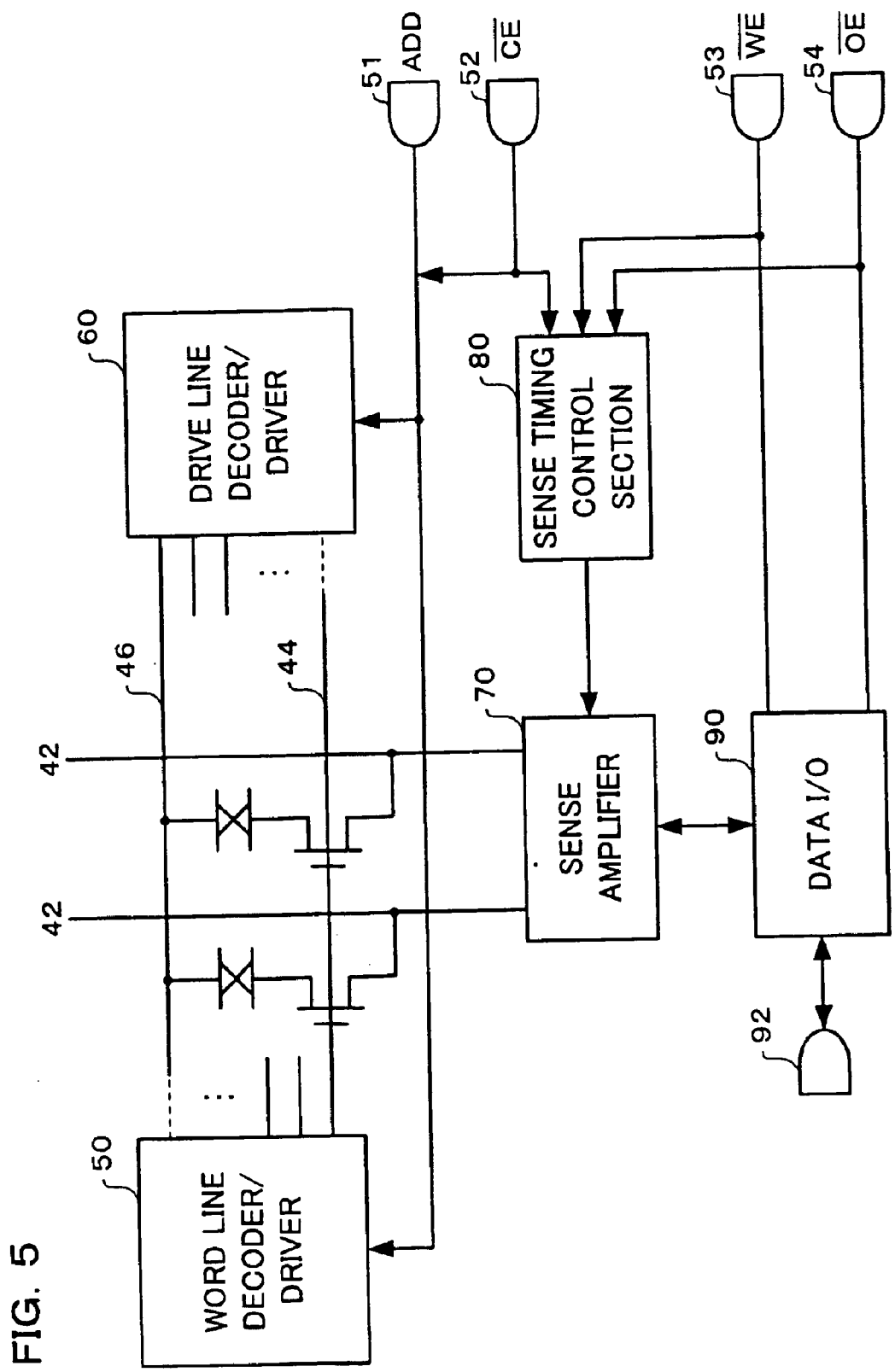
FIG. 5 is a view showing the circuit of the ferroelectric memory device according to the first embodiment of the present invention.

FIG. 5 is a view showing a circuit of the ferroelectric memory device according to the present embodiment. The action of the ferroelectric memory device will be described with reference to FIG. 5.

In the case of writing data into the ferroelectric memory device, an address signal is supplied from an address terminal 51, a select signal is supplied from a chip-select terminal 52, and a write control signal is supplied from a write control terminal 53. A word line decoder/driver 50 turns ON the designated word line 44, with one of a plurality (two) of bit lines 42 turned ON, with the other bit line 42 turned OFF. A drive line decoder/driver 60 applies a positive pulse to the designated drive line 46. Then, residual polarization caused by the hysteresis characteristics of the ferroelectric film 34 remains in the ferroelectric capacitor, whereby information can be retained even if the power is turned off.

In the case of reading data from the ferroelectric memory device, the bit line 42 is left floating and the word line 44 is turned ON, thereby selecting the memory cell. Then, a positive voltage is applied to the drive line 46 and displacement current caused by polarization inversion of the ferroelectric capacitor is amplified using a sense amplifier 70. A sense timing control section 80 controls sense timing and supplies data to a data I/O 90. The data I/O 90, which is connected to a device 92 including a CPU and other memory devices, controls data transmission.

The present invention is not limited to the above embodiment and various modifications are possible. For example, instead of forming all of the first electrodes 32, ferroelectric films 34, and second electrodes 36 by the selective deposition process, at least one of these members may be formed by the selective deposition process. In particular, it is unnecessary to perform etching by applying the selective deposition process when forming the first electrode 32 and the second electrode 36, thereby preventing degradation of the characteristics of the ferroelectric films 34.

Second Embodiment

FIGS. 6A to 7C are views showing a method of manufacturing a ferroelectric memory device according to a second embodiment of the present invention. In the present embodiment, capacitor sections are formed on a substrate 110 shown in FIG. 6A. The description for the substrate 10 in the first embodiment is applicable to the substrate 110.

Formation of First Electrode

Figure 6A:
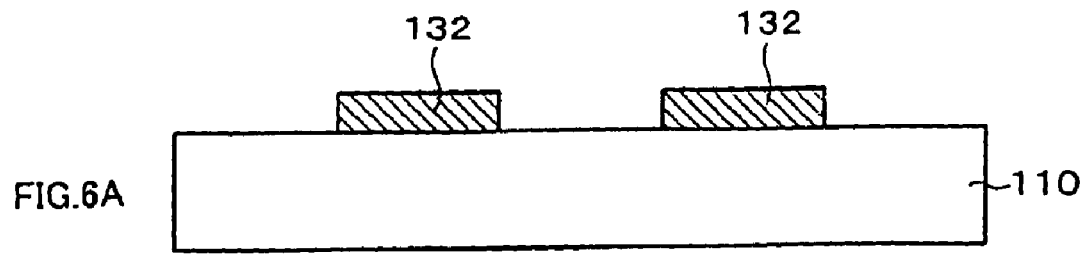
FIGS. 6A to 6C are views showing a method of manufacturing a ferroelectric memory device according to a second embodiment of the present invention.

First electrodes (lower electrodes) 132 are formed on the substrate 110, as shown in FIG. 6A. The first electrodes 132 are formed by forming a layer of an electrode material for the first electrodes 132 on the substrate 110 and patterning the formed electrode material, for example.

There are no specific limitations to the electrode material insofar as the material has a function of forming part of the ferroelectric capacitor. For example, in the case of using lead zirconate titanate (PZT) as the material for forming ferroelectric films 134 (see FIG. 7C), a monolayer or lamination layer of platinum (Pt), iridium (Ir), compounds thereof, and the like is suitable as the electrode material for the first electrodes 132.

As the method of forming a layer of the electrode material, sputtering, vacuum evaporation, CVD, or the like can be used. As the patterning method, lithographic technology can be used. In addition, the selective deposition process described in the first embodiment may be used.

Layer Forming of Ferroelectric Material

Figure 6B:
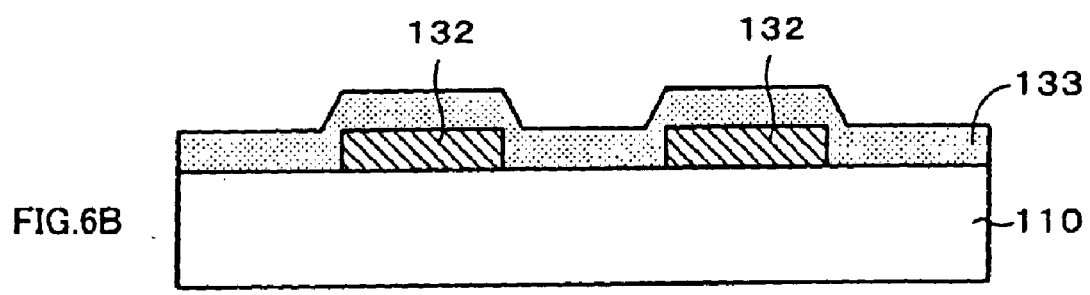

A layer of a ferroelectric material 133 is formed as shown in FIG. 6B. Specifically, the ferroelectric material 133 is formed on the surface (may be the entire surface) of the substrate 110 on which the first electrodes 132 are formed so as to cover the first electrodes 132.

As the composition of the ferroelectric material 133, perovskite oxide ferroelectrics such as lead titanate, lead zirconate titanate (PZT), and lead zirconate; bismuth-substrated layered oxides such as strontium bismuth tantalate (SBT); organic polymer ferroelectrics such as polyvinylidene fluoride, vinylidene fluoride/ethylene trifluoride copolymer, and vinylidene cyanide/vinyl acetate copolymer; or the like can be used.

As the method of forming a layer of the ferroelectric material 133, sputtering, CVD (MOCVD), sol-gel process, MOD, or the like can be used. For example, in the case of forming a layer of the ferroelectric material 133 using lead zirconate titanate by a sol-gel process, a solution (sol) in which titanium tetraisopropoxide, tetra-n-propoxyzirconium, and lead acetate are dissolved in an organic solvent such as 2-n-butoxyethanol and diethanolamine is used.

Formation of Surface-Modifying Film

Figure 6C:
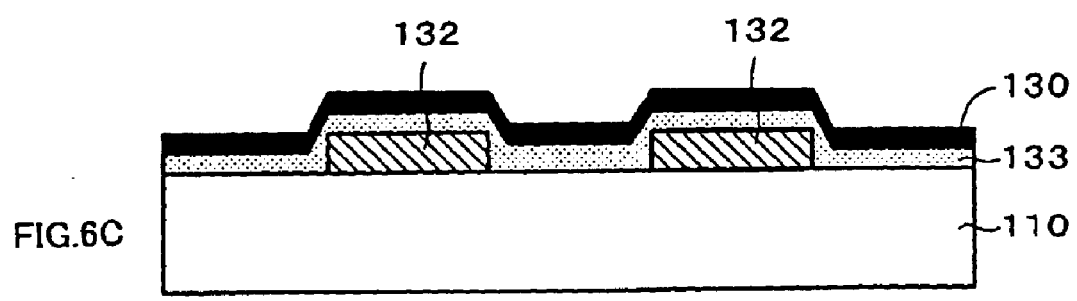

A surface-modifying film 130 is formed on the surface (may be the entire surface) of the formed ferroelectric material 133, as shown in FIG. 6C. The description for the surface-modifying film 30 in the first embodiment is applicable to the surface-modifying film 130, which is formed in the same manner as the surface-modifying film 30.

Patterning of Surface-Modifying Film

Figure 7A:
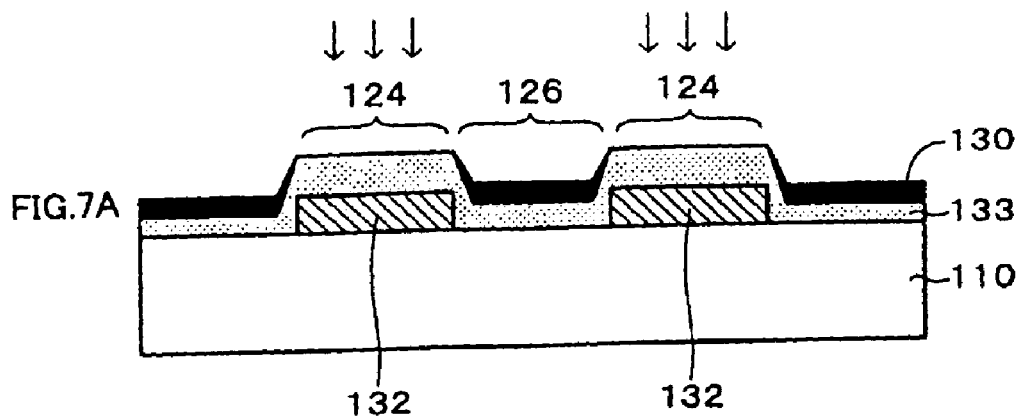
FIGS. 7A to 7C are views showing the method of manufacturing a ferroelectric memory device according to the second embodiment of the present invention.

The surface-modifying film 130 formed on the formed ferroelectric material 133 is removed in the regions where the first electrodes 132 are formed, as shown in FIG. 7A. The surface-modifying film 130 is allowed to remain in a second region 126. As a method of patterning the surface-modifying film 130, the patterning method for the surface-modifying film 30 described in the first embodiment can be applied.

As a result of these steps, the surface conditions of the formed ferroelectric material 133 differ between first regions 124 and the second region 126 which is covered with the surface-modifying film 130, as shown in FIG. 7A. This produces a difference in the affinity to the electrode material for forming second electrodes 136.

In the present embodiment, the surface-modifying film 130 is removed in the regions corresponding to the first electrodes 132. The above description should not be construed as limiting the present invention. The surface-modifying film 130 may be selectively removed according to the structure (formation region) of the second electrodes necessary for the structure of the device to be manufactured.

Formation of Second Electrode

Figure 7B:
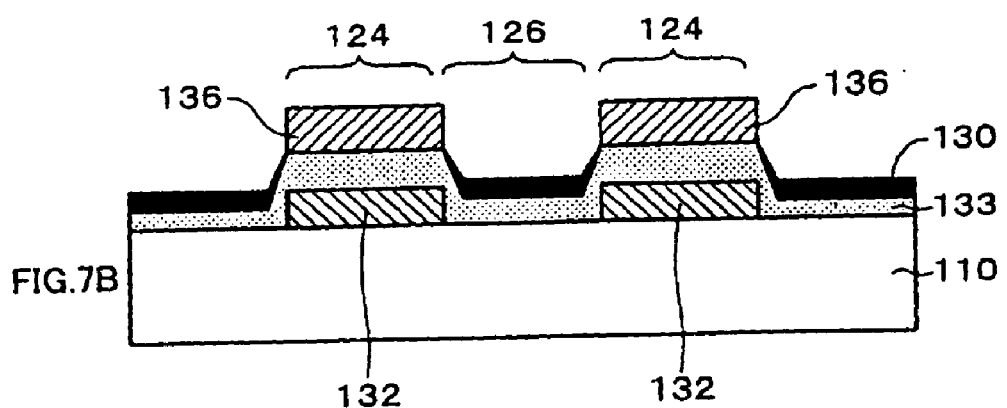

The second electrodes 136 are formed by selectively depositing the electrode material in the regions corresponding to the first regions 124, as shown in FIG. 7B. As the deposition method, sputtering, CVD (MOCVD), sol-gel process, MOD, electroplating, electroless plating, or the like can be used. The details are the same as described for the first electrode 32 in the first embodiment.

Etching of Formed Ferroelectric Material

Figure 7C:
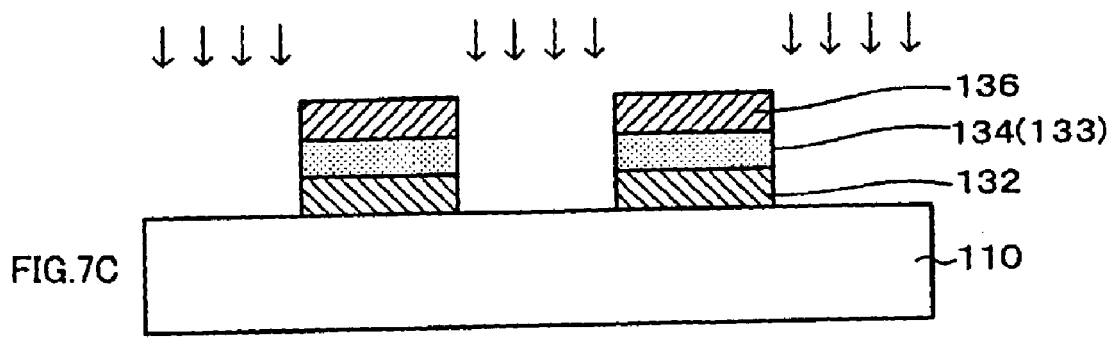

The formed ferroelectric material 133 is etched, as shown in FIG. 7C. Specifically, the ferroelectric material 133 is etched using the second electrodes 136 as masks.

As the etching method, parallel-plate reactive ion etching (RIE), dry etching using a plasma source such as inductively coupled plasma (ICP) or electron cyclotron resonance (ECR), or the like can be used.

There are no specific limitations to the etching gas insofar as the formed ferroelectric material 133 can be etched. For example, in the case of using PZT as the ferroelectric material 133, fluorine-substrated gas such as $CF_4$, $C_4F_8$, and $C_5F_8$, chlorine-substrate gas such as $Cl_2$ and $BCl_3$, Ar, $O_2$, and the like can be used individually or in combination of two or more. It is particularly preferable to use fluorine-substrated gas. Use of fluorine-substrated gas increases etching selectivity of the ferroelectric material 133 for Pt or Ir which is suitably used as the constituent material for the first electrodes 132 and the second electrodes 136.

The ferroelectric memory device can be manufactured by these steps, as shown in FIG. 7C. According to the present embodiment, the second electrodes 136 can be formed without etching.

Third Embodiment

FIGS. 8A to 9C are views showing a method of manufacturing a ferroelectric memory device according to a third embodiment of the present invention. In the present embodiment, capacitor sections are formed on the substrate 110 shown in FIG. 8A. The description for the substrate 10 in the first embodiment is applicable to the substrate 110.

Formation of First Electrode

The first electrodes 132 (lower electrodes) are formed on the substrate 110, as shown in FIG. 8A. The details are described in the second embodiment.

Layer Formation of Ferroelectric Material

A layer of a ferroelectric material 233 is formed, as shown in FIG. 8A. Specifically, a layer of the ferroelectric material 133 is formed on the surface of the substrate 110 on which the first electrodes 132 are formed to cover the first electrodes 132.

As the composition of the ferroelectric material 233, perovskite oxide ferroelectrics such as lead titanate, lead zirconate titanate (PZT), and lead zirconate; bismuth-substrated layered oxides such as strontium bismuth tantalate (SBT); organic polymer ferroelectrics such as polyvinylidene fluoride, vinylidene fluoride/ethylene trifluoride copolymer, and vinylidene cyanide/vinyl acetate copolymer; or the like can be used.

In the present embodiment, a ferroelectric material exhibiting patterning characteristics upon irradiation with energy rays is used as the ferroelectric material (precursor) 233. The term "patterning characteristics upon irradiation with energy rays" means that the crosslinking reaction, decomposition reaction, modification reaction, or the like of the ferroelectric material (precursor) 233 is induced by energy rays, whereby either the irradiated region or unirradiated region can be selectively removed using a chemical solution.

For example, a raw material solution, in which orthonitrobenzaldehyde (photosensitizer) is added to a sol-gel solution containing lead acetate (II) trihydrate, zirconium tetra-n-butoxide, and titanium tetraisopropoxide which is distilled using 2-methoxyethanol, is applied to the substrate 110 using spin coating. The applied solution is dried on a hot plate at 95° C. for 1 hour to form a precursor film with a predetermined thickness.

As the application method, roll coating, spray coating, dip coating, or the like can be used other than spin coating.

The formed ferroelectric material 233 is then patterned. For example, the ferroelectric material 233 is removed in the regions in which the first electrode 132 is not formed, as shown in FIG. 8C. The ferroelectric material 233 is allowed to remain on the first electrodes 132.

For example, the formed ferroelectric material 233 is exposed to light with a wavelength of 365 nm through a reticle (mask, not shown), as shown in FIG. 8B. The reticle (mask) has a shading layer formed so as to transmit light only in the region corresponding to the region in which the ferroelectric films 234 will be formed (see FIG. 8C).

In the present embodiment, light with a wavelength of 365 nm is used corresponding to orthonitrobenzaldehyde used as the photosensitizer. Light (energy ray) with various wavelengths can be used by changing the photosensitizer.

Then, the unexposed area is removed by developing the ferroelectric material 233 for 60–120 minutes using a developer in which 2-methoxyethanol and isopropyl alcohol are mixed in a ratio of 1:1, thereby patterning the precursor film. The precursor film is heated on a hot plate at 350° C. for 10 minutes. The above steps are repeated until the desired film thickness is obtained.

The resulting precursor film is crystallized by annealing at 600° C. for 60 minutes in an annealing furnace, thereby obtaining the patterned ferroelectric films 234, as shown in FIG. 8C.

Formation of Surface-Modifying Film

Figure 9A:
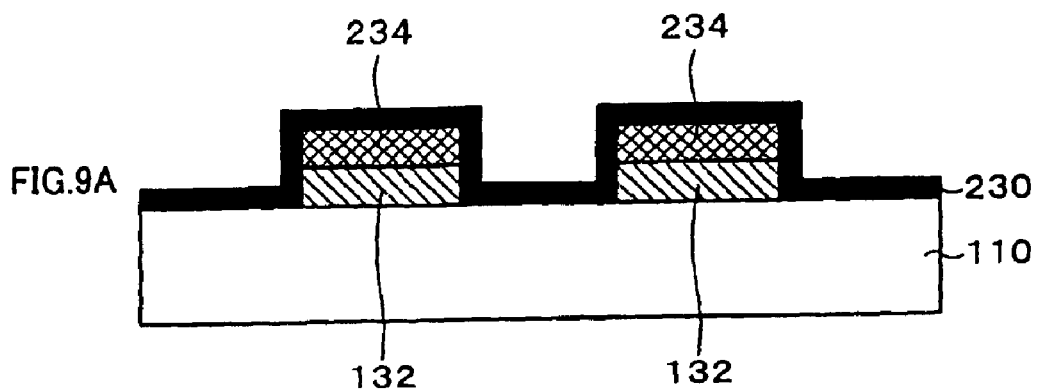
FIGS. 9A to 9C are views showing the method of manufacturing a ferroelectric memory device according to the third embodiment of the present invention.

A surface-modifying film 230 is formed on the surface (may be the entire surface) of the substrate 110 on which the first electrodes 132 and the ferroelectric films 234 are formed, as shown in FIG. 9A. The surface-modifying film 230 is formed to cover the exposed surface of the substrate 110 from the first electrodes 132 and the ferroelectric films 234, the upper surface and the side of the ferroelectric films 234, and the side of the first electrodes 132. The description for the surface-modifying film 30 in the first embodiment is applicable to the surface-modifying film 230.

Patterning of Surface-Modifying Film

The upper surface of the ferroelectric films 234 is exposed by removing the surface-modifying film 230 from at least part of the surface of the ferroelectric films 234, thereby forming first regions 224. The surface-modifying film 230 is allowed to remain in another region which becomes a second region 226. As a result, the material for forming second electrodes 236 is less deposited in the second region 226 (the surface of the substrate 110, the side of the first electrodes 132, and the side of the ferroelectric film 234) by the presence of the surface-modifying film 230, in comparison with the first regions 224.

As the method of patterning the surface-modifying film 230, the method of patterning the surface-modifying film 30 in the first embodiment can be applied.

Figure 9B:
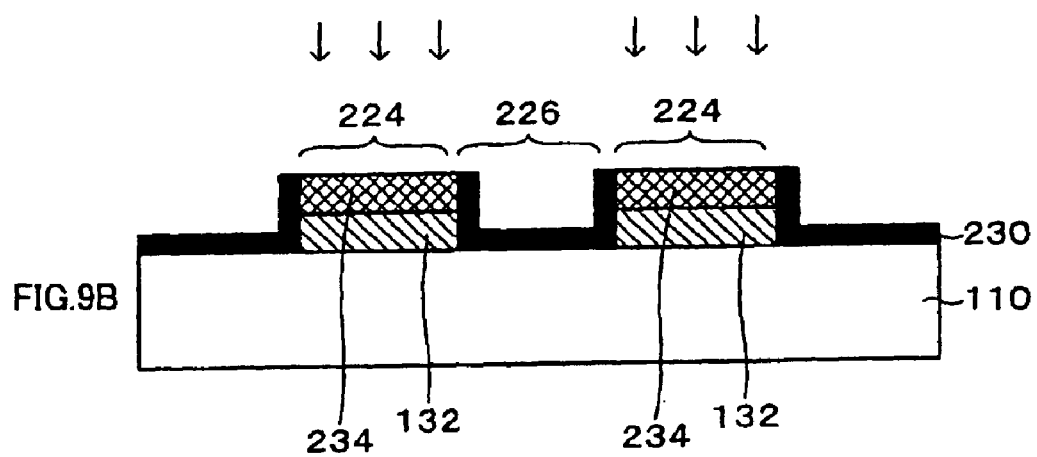

As a result of these steps, the surface conditions differ between the first regions 224 and the second region 226 which is covered with the surface-modifying film 230, as shown in FIG. 9B, thereby producing a difference in the affinity to the electrode material for forming the second electrodes 236.

Formation of Second Electrode

Figure 9C:
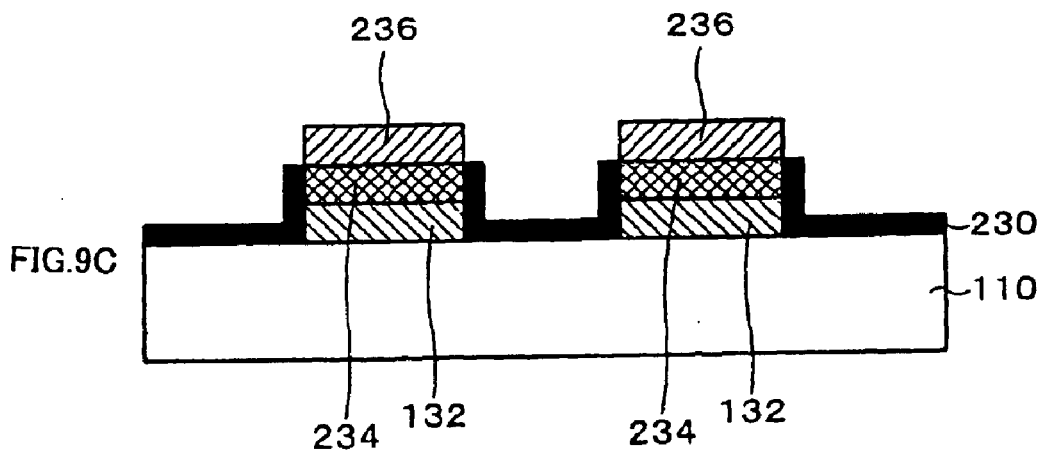

The second electrodes 236 are formed by selectively depositing the electrode material in the regions corresponding to the first regions 224, as shown in FIG. 9C. As the deposition method, sputtering, CVD (MOCVD), sol-gel process, MOD, electroplating, electroless plating, or the like can be used. Other details are as described for the first electrodes 32 in the first embodiment. Specifically, in the present embodiment, the second electrodes 236 are formed in the same manner as the first electrodes 32 in the first embodiment.

Removal of Surface-Modifying Film, etc.

The surface-modifying film 130 shown in FIG. 9C may be removed, as required. The details are described in the first embodiment. Note that the step of removing the surface-modifying film 230 is not a necessary condition of the present invention. The surface-modifying film 230 may be allowed to remain.

The ferroelectric memory device can be manufactured by these steps. According to the present embodiment, the second electrodes 236 can be formed without etching. Moreover, in the present embodiment, the ferroelectric film 234 is also formed without etching.

Fourth Embodiment

FIGS. 10A to 12B are views showing a method of manufacturing a ferroelectric memory device according to a fourth embodiment of the present invention.

Formation of Transistor and Capacitor Section

The transistors 12 and the capacitor sections are formed on the substrate 10, as shown in FIG. 10A. The details are described in the first embodiment. A second region 326 is formed above the first regions 24 with respect to the substrate 10. The capacitor sections of the ferroelectric memory device are formed in the first regions 24 in a step described later.

Formation of Partition Member

In the present embodiment, partition members 328 are formed as shown in FIG. 10B. The partition members 328 are formed in regions other than the regions in which the capacitor sections of the ferroelectric memory device are formed (first regions 24). It is preferable that the partition members 328 separate the regions for forming the capacitor sections. The thickness of the partition members 328 is preferably equal to or greater than that of the capacitor sections.

As the partition members 328, an insulating material such as $SiO_2$, SiN, or $TiO_2$ can be used. If the material is removed in the succeeding step, Au or the like may be used. The partition members 328 are formed by forming a layer of the material over the entire surface of the substrate and patterning the film so as to be present in regions other than the first regions 24 using photolithography and etching.

Formation of Surface-Modifying Film

In the present embodiment, a surface-modifying film 330 is formed as shown in FIG. 10C. The region in which the surface-modifying film 330 is formed becomes the second region 326. For example, the surface-modifying film 330 is formed over the entire surface of the substrate on which the partitions are formed, and the surface-modifying film 330 is then removed in the region other than at least the upper surface of the partition members 328. The details are as described in the first embodiment.

Patterning of Surface-Modifying Film

After forming the surface-modifying film 330 over the entire surface of the substrate, the surface-modifying film 330 is removed in the first regions 24. The surface-modifying film 330 on the side of the partition members 328 may be removed. The details are as described in the first embodiment.

Formation of First Electrode

The first electrodes 32 which become the lower electrodes of the capacitor sections of the ferroelectric memory device are formed in the regions corresponding to the first regions 24, as shown in FIG. 11A. The details are as described in the first embodiment.

Formation of Ferroelectric Film

The ferroelectric films 34 are formed on the first electrodes 32, as shown in FIG. 11B. The details are described in the first embodiment.

In the present embodiment, since the first regions 24 are separated by the partition members 328, the side of the first electrodes 32 are in contact with the partition members 328. Therefore, the material for the ferroelectric films 34 does not adhere to the side of the first electrodes 32.

Formation of Second Electrode

The second electrodes 36 which become the upper electrodes are formed on the ferroelectric films 34, as shown in FIG. 11C. The details are as described in the first embodiment.

In the present embodiment, since the first regions 24 are separated by the partition members 328, the sides of the first electrodes 32 and the ferroelectric films 34 are in contact with the partition members 328. Therefore, the material for the second electrodes 36 does not adhere to the side of the first electrode 32 and the ferroelectric film 34.

Removal of Surface-Modifying Film, etc.

Figure 12A:
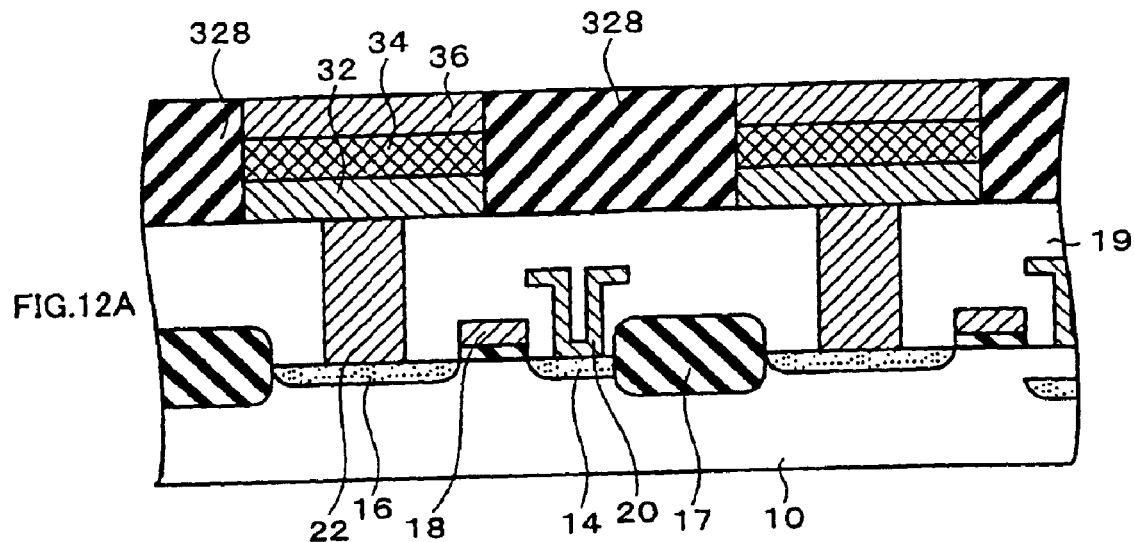
FIGS. 12A to 12B are views showing a method of manufacturing a ferroelectric memory device according to an embodiment of the present invention.

The surface-modifying films 330 constituting the second region 326 may be removed, as shown in FIG. 12A. The details are as described in the first embodiment.

Figure 12B:
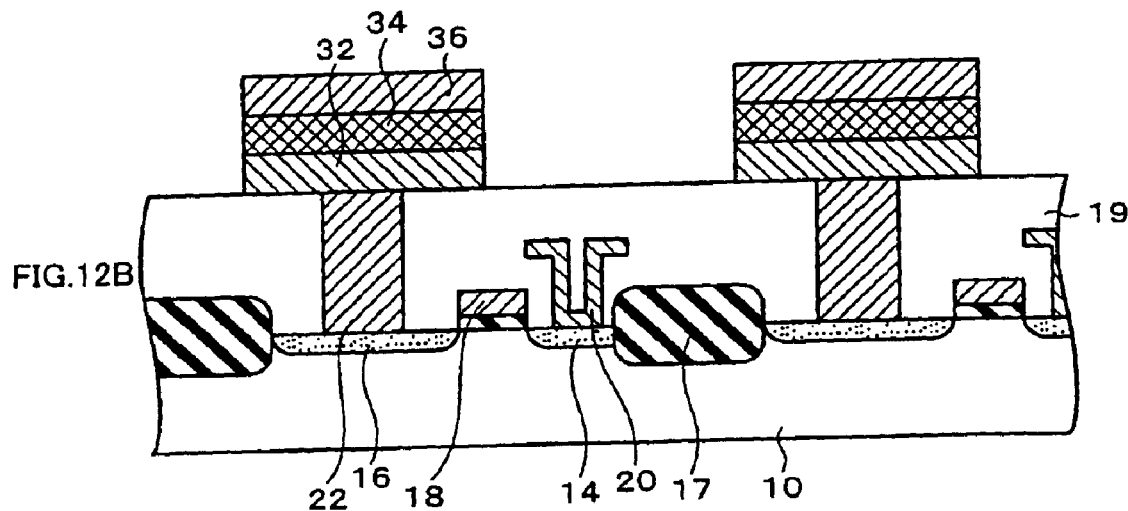
Figure 13:
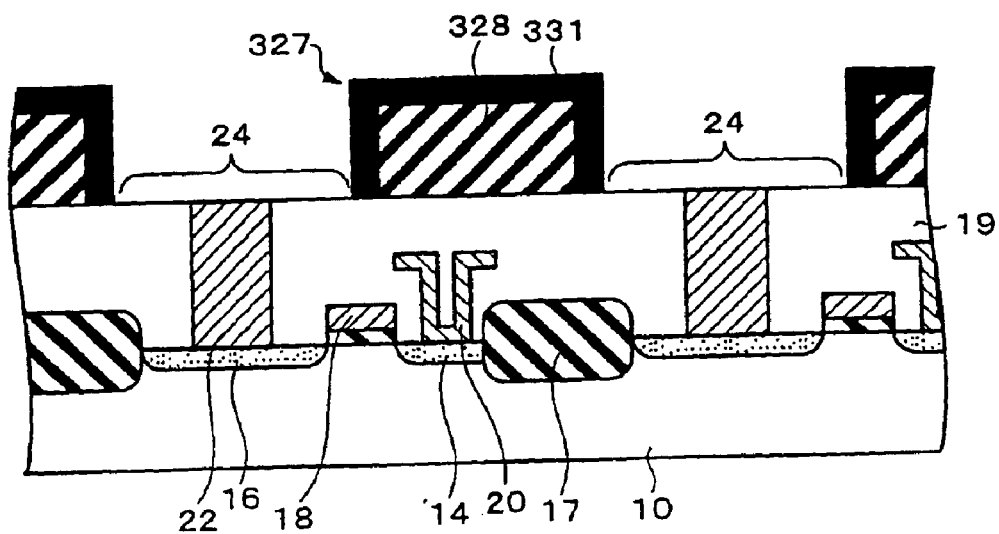
FIG. 13 is a view showing an example of a modification of a method of manufacturing a ferroelectric memory device according to an embodiment of the present invention.

Moreover, the partition members 328 may be removed, as shown in FIG. 12B. This step is not a necessary condition of the present invention, and the partition members 328 may be allowed to remain. In the present embodiment, the surface of the second region 326 is formed by the upper surface of the partition member 328.

Structure of Ferroelectric Memory Device

The ferroelectric memory device can be manufactured by these steps. According to the present embodiment, the first electrodes 32, the ferroelectric films 34, and the second electrodes 36 can be formed without etching using a mask. Since the first regions 24 are separated by the partition members 328, at least one of the materials for the ferroelectric films 34 and the second electrodes 36 can be prevented from adhering to the sides of first electrodes 32. Moreover, the material for the second electrodes 36 can be prevented from adhering to the sides of the ferroelectric films 34. In particular, since the material for the second electrodes 36 can be prevented from adhering to the sides of the ferroelectric films 34, a problem in which the capacitor section cannot be formed due to conduction between the first electrodes 32 and the second electrodes 36 can be prevented.

In this ferroelectric memory device, the partition members 328 may be formed in the region other than the first regions 24. The second region 326, in which the vapor-phase or liquid-phase material for the capacitor section is less deposited in comparison with the surface of the substrate, may be formed using the surface-modifying film 330 or the like. The second region 326 may be formed on the upper surface of the partition members 328.

The present invention is not limited to the above-described embodiment and various modifications are possible. For example, instead of forming all of the first electrode 32, ferroelectric film 34, and second electrode 36 by the selective deposition process, at least one of these may be formed by the selective deposition process. In particular, it is unnecessary to perform etching by applying the selective deposition process when forming the first electrode 32 and the second electrode 36, thereby preventing degradation of the characteristics of the ferroelectric film 34.

In the present embodiment, the surface-modifying film 331 is formed on the upper surface of the partition members 328. The surface-modifying film 331 may be formed on the upper surface and the sides of the partition members 328. In this case, the upper surface and the sides of the partition members 328 form a second region 327 having surface characteristics in which the material for forming at least one member of the capacitor section is less deposited.

What is claimed is:

1. A ferroelectric memory device provided with a capacitor section having a structure in which a first electrode, a ferroelectric film, and a second electrode are deposited, the ferroelectric memory device comprising:

a first material forming the first electrode;

a second material forming the ferroelectric film on the first electrode;

a third material forming the second electrode on the ferroelectric film; and a base having a first region and a second region, the first region having a first affinity to the first material, the second region having a second affinity to the first material, the second affinity being lower than the first affinity, the first material provided at least in the first region.

2. A ferroelectric memory device comprising:

a base having a first region and a second region around the first region;

a first electrode formed of a material in the first region;

a ferroelectric film formed on the first electrode; and a second electrode formed on the ferroelectric film, wherein the first region has a first affinity to the material and the second region has a second affinity to the material, the second affinity being lower than the first affinity.

3. The ferroelectric memory device as defined in claim 2, wherein the base has a transistor formed therein, the transistor connected to at least one of the first electrode and the second electrode.

4. A ferroelectric memory device provided with a capacitor section having a structure in which a first electrode, a ferroelectric film, and a second electrode are deposited, the ferroelectric memory device comprising:

a first material forming the first electrode, the first electrode having a first region;

a second region around the first region;

a second material forming the ferroelectric film;

the first region having a first affinity to the second material and the second region having a second affinity to the second material, the second affinity being lower than the first affinity; and a third material forming the second electrode on the ferroelectric film.

5. A ferroelectric memory device provided with a capacitor section having a structure in wich a first electrode, a ferroelectric film, and a second electrode are deposited, the ferroelectric memory device comprising:

a first material forming the first electrode;

a second material forming the ferroelectric film, the ferroelectric film having a first region;

a second region around the first region;

a third material forming the second electrode at least in the third region;

the first region having a first affinity to the third material and the second region having a second affinity to the third material, the second affinity being lower than the first affinity.

6. A ferroelectric memory device comprising:

a base having a first region and a second region around the first region;

a first electrode in the first region;

a ferroelectric film formed of a material on the first electrode; and a second electrode formed on the ferroelectric film, wherein the first region has a first affinity to the material and the second region has a second affinity to the material, the second affinity being lower than the first affinity.

7. The ferroelectric memory device as defined in claim 6, wherein the base has a transistor formed therein, the transistor connected to at least one of the first electrode and the second electrode.

8. A ferroelectric memory device comprising:

a base having a first region and a second region around the first region;

a first electrode formed in the first region;

a ferroelectric film formed on the first electrode; and a second electrode of a material formed on the ferroelectric film, wherein the first region has a first affinity to the material and the second region has a second affinity to the material, the second affinity being lower than the first affinity.

9. The ferroelectric memory device as defined in claim 8, wherein the base has a transistor formed therein, the transistor connected to at least one of the first electrode and the second electrode.

* * * * *